(12) United States Patent
Baik et al.

(10) Patent No.: US 8,293,124 B2
(45) Date of Patent: Oct. 23, 2012

(54) METHOD OF MULTI-STAGE SUBSTRATE ETCHING AND TERAHERTZ OSCILLATOR MANUFACTURED USING THE SAME METHOD

(75) Inventors: Chan Wook Baik, Seongnam-si (KR); Seog Woo Hong, Yongin-si (KR); Jong Seok Kim, Hwaseong-si (KR); Seong Chan Jun, Seoul (KR); Sun Il Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1254 days.

(21) Appl. No.: 12/073,311

(22) Filed: Mar. 4, 2008

(65) Prior Publication Data

US 2009/0120903 A1    May 14, 2009

(30) Foreign Application Priority Data

Nov. 9, 2007  (KR) .................. 10-2007-0114456

(51) Int. Cl.
  *G03F 7/20* (2006.01)
  *B44C 1/22* (2006.01)
(52) U.S. Cl. .............. 216/36; 216/41; 216/56; 430/323
(58) Field of Classification Search ................. None
  See application file for complete search history.

(56) References Cited

U.S. PATENT DOCUMENTS

| 5,161,774 | A  | * | 11/1992 | Engelsdorf et al. ........... 251/11 |
| 5,309,943 | A  | * | 5/1994  | Stevenson et al. ....... 137/625.5 |
| 5,333,831 | A  | * | 8/1994  | Barth et al. .................. 251/11 |
| 5,505,807 | A  | * | 4/1996  | Min et al. .................... 156/230 |
| 6,260,960 | B1 | * | 7/2001  | Hashizume et al. ........... 347/70 |
| 6,393,685 | B1 | * | 5/2002  | Collins ......................... 29/416 |
| 6,533,947 | B2 | * | 3/2003  | Nasiri et al. .................. 216/2 |
| 6,544,863 | B1 |   | 4/2003  | Chong et al. |
| 6,554,408 | B1 | * | 4/2003  | Miki et al. .................... 347/70 |
| 6,872,319 | B2 | * | 3/2005  | Tsai ............................... 216/2 |
| 7,172,911 | B2 | * | 2/2007  | Kalvesten et al. ............. 438/29 |
| 7,225,524 | B2 | * | 6/2007  | Lee et al. ...................... 29/594 |
| 7,250,112 | B2 | * | 7/2007  | Nasiri et al. .................. 216/2 |

(Continued)

FOREIGN PATENT DOCUMENTS

KR    1020040086679    10/2004

*Primary Examiner* — Allan Olsen
(74) *Attorney, Agent, or Firm* — Harness, Dickey & Pierce, P.L.C.

(57) ABSTRACT

A method of multi-stage substrate etching is provided. The method comprises the steps of: forming a first mask pattern on one surface of a first substrate; forming a hole by etching the first substrate using the first mask pattern as an etching mask; forming a second mask pattern on one surface of a second substrate; forming a hole by etching the second substrate to a predetermined depth using the second mask pattern as an etching mask; bonding the first and second substrates together such that an etched surface of the first substrate faces an etched surface of the second substrate; forming a third mask pattern on the second substrate; and forming a hole passing through the second substrate by etching the second substrate using the third mask pattern as an etching mask, whereby it is prevented the occurrence of a radius of curvature in the bottom surface and the overhang structure occurring on a step surface, so that etching quality is improved, a precise bonding between the substrates is obtained using the alignment key positioned on each substrate, and a multi-layer process is carried out.

6 Claims, 7 Drawing Sheets

U.S. PATENT DOCUMENTS

| | | | |
|---|---|---|---|
| 7,303,935 B2 * | 12/2007 | DeNatale et al. | 438/48 |
| 7,393,758 B2 * | 7/2008 | Sridhar et al. | 438/460 |
| 7,442,570 B2 * | 10/2008 | Nasiri et al. | 438/48 |
| 7,458,263 B2 * | 12/2008 | Nasiri et al. | 73/504.12 |
| 7,459,093 B1 * | 12/2008 | Fu | 216/2 |
| 7,731,904 B2 * | 6/2010 | Okamoto et al. | 422/504 |
| 7,789,493 B2 * | 9/2010 | Chung et al. | 347/68 |
| 7,796,315 B1 * | 9/2010 | Fu | 359/224.1 |
| 7,802,872 B2 * | 9/2010 | Conta et al. | 347/59 |
| 7,810,379 B2 * | 10/2010 | DeNatale et al. | 73/54.01 |
| 7,812,416 B2 * | 10/2010 | Courcimault | 257/414 |
| 2003/0039021 A1 * | 2/2003 | Ton | 359/290 |
| 2003/0107794 A1 * | 6/2003 | Siekkinen et al. | 359/291 |
| 2006/0162146 A1 * | 7/2006 | Shcheglov et al. | 29/594 |
| 2007/0099395 A1 * | 5/2007 | Sridhar et al. | 438/460 |
| 2007/0267708 A1 * | 11/2007 | Courcimault | 257/414 |

* cited by examiner

METHOD OF MULTI-STAGE SUBSTRATE ETCHING AND TERAHERTZ OSCILLATOR MANUFACTURED USING THE SAME METHOD

PRIORITY STATEMENT

This application claims priority under U.S.C. § 119 to Korean Patent Application No. 10-2007-0114456, filed on Nov. 9, 2007, in the Korean Intellectual Property Office (KIPO).

BACKGROUND OF THE INVENTION

1. Field of the Invention

The present invention relates to a method of multi-stage substrate etching and a terahertz oscillator manufactured using the same method, and more particularly to a method of multi-stage substrate etching in which a first substrate is etched to a desired depth, a second substrate previously etched to a certain depth is bonded to the first substrate such that the etched surface thereof faces the first substrate, and finally the second substrate is etched again to thereby form a step structure, and a terahertz oscillator manufactured using the same method.

2. Description of the Prior Art

A terahertz band is very important with respect to applications of molecular optics, biological physics, medical science, spectroscopy, image processing appliances, and security appliances. Nevertheless the importance of the terahertz band ranged between an existing microwave band and optical frequency, it is true that there is few currently developed oscillator or amplifier using the same band due to various physical, engineering limitations. Recently, such a terahertz band oscillator or amplifier has been developed owing to appearance of diverse new concepts and an advance in micro processing technology.

In addition to efforts to increase frequency of existing microwave band oscillators, there are attempts to lower the operating frequency to have a terahertz band using optical instruments such as a semiconductor laser or a femtosecond laser. Furthermore, recently, attempts have been made to fabricate a compact size terahertz oscillator.

Among the attempts, there has been developed a method of forming a 3D microstructure having, on a substrate, a plurality of steps using MEMS technology. In particular, to form a plurality of steps on a substrate such as Si wafer, a method has been proposed in which a plurality of mask patterns are sequentially deposited on the substrate and repeatedly etched to remove them to thereby fabricate various step structures.

Meanwhile, there has been proposed another method of multi-stage etching using wafer bonding. Herein, a pre-patterned protection layer is bonded to a first wafer, a second wafer is patterned and etched, and the first wafer is finally etched using the pre-patterned protection layer. However, in case of such a multi-stag etching method, a bottom face thereof is irregularly etched to create a radius of curvature thereon, and an etched wall face is shaped like an alphabet character T.

SUMMARY OF THE INVENTION

The present invention has been made to solve the problems occurring in the prior art, and an object of the present invention is to provide a method of multi-stage etching capable of preventing the creation of a deviation in depth of an etched bottom face even in a deep step, a radius of curvature of an edge, a T-shape of a wall face, an overhang structure occurring due to irregular etching on a step face, and a terahertz oscillator manufactured using the same method.

In accordance with an aspect of the present invention, there is provided a method of multi-stage substrate etching comprising the steps of: forming a first mask pattern on one surface of a first substrate; forming a hole by etching the first substrate using the first mask pattern as an etching mask; forming a second mask pattern on one surface of a second substrate; forming a hole by etching the second substrate to a predetermined depth using the second mask pattern as an etching mask; bonding the first and second substrates together such that an etched surface of the first substrate faces an etched surface of the second substrate; forming a third mask pattern on the second substrate; and forming a hole passing through the second substrate by etching the second substrate using the third mask pattern as an etching mask.

In accordance with another aspect of the present invention, there is provided a terahertz oscillator manufactured by a multi-stage substrate etching method and comprising two or more structures bonded together, wherein the method comprises the steps of: forming a first mask pattern on one surface of a first substrate and forming a hole by etching the first substrate using the first mask pattern as an etching mask; forming a second mask pattern on one surface of a second substrate and forming a hole by etching the second substrate to a predetermined depth using the second mask pattern as an etching mask; bonding the first and second substrates together such that an etched surface of the first substrate faces an etched surface of the second substrate; and forming a third mask pattern on the second substrate and forming a hole passing through the second substrate by etching the second substrate using the third mask pattern as an etching mask.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE EXEMPLARY EMBODIMENTS

Hereinafter, exemplary embodiments of the present invention will be described with reference to the accompanying drawings.

FIGS. 1A to 1H are views illustrating a procedure of an exemplary embodiment a method of multi-stage substrate etching according to the present invention.

Figure 1A:
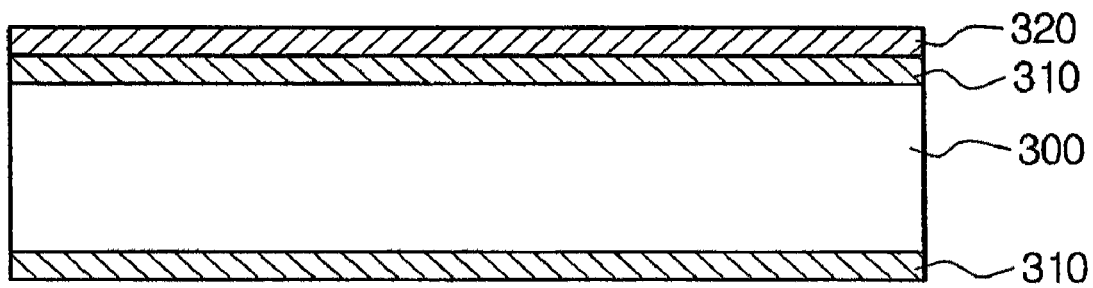
FIGS. 1A to 1H are views illustrating a procedure of an exemplary embodiment a method of multi-stage substrate etching according to the present invention.
Figure 1B:
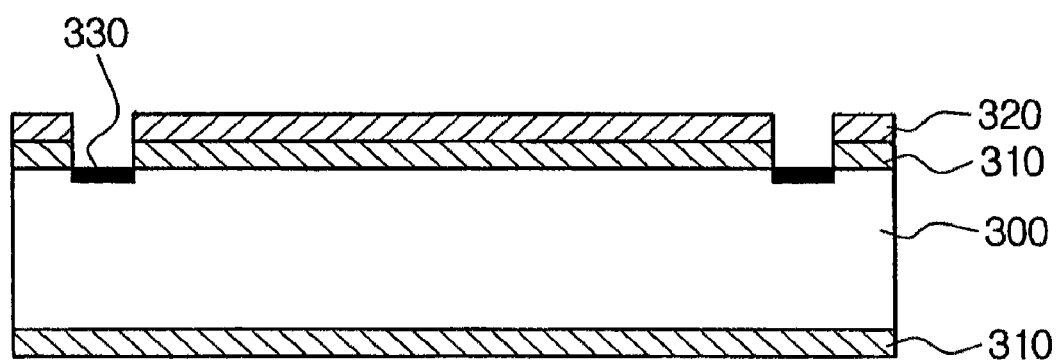
Figure 1C:
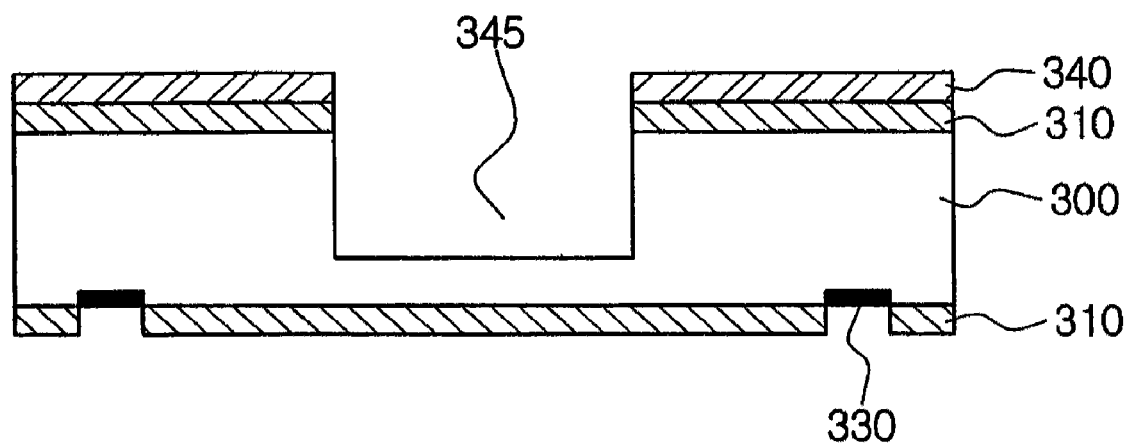
Figure 1D:
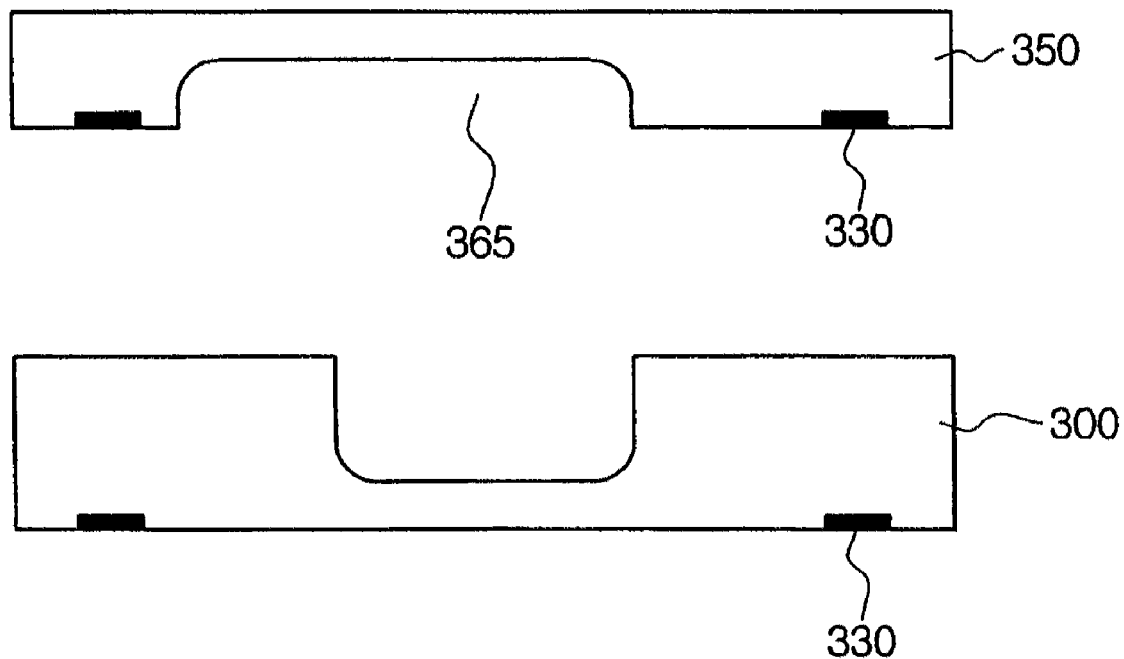
Figure 1E:
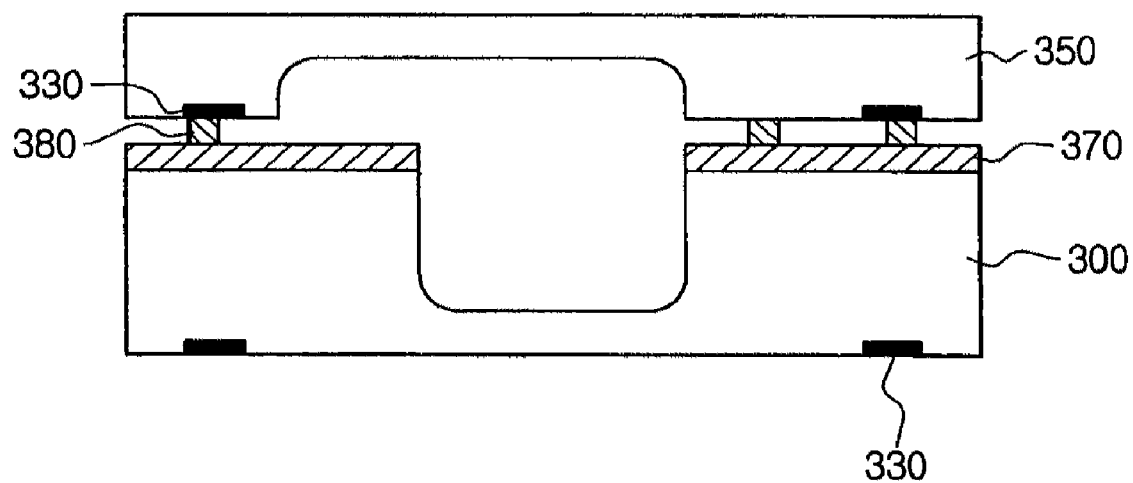
Figure 1F:
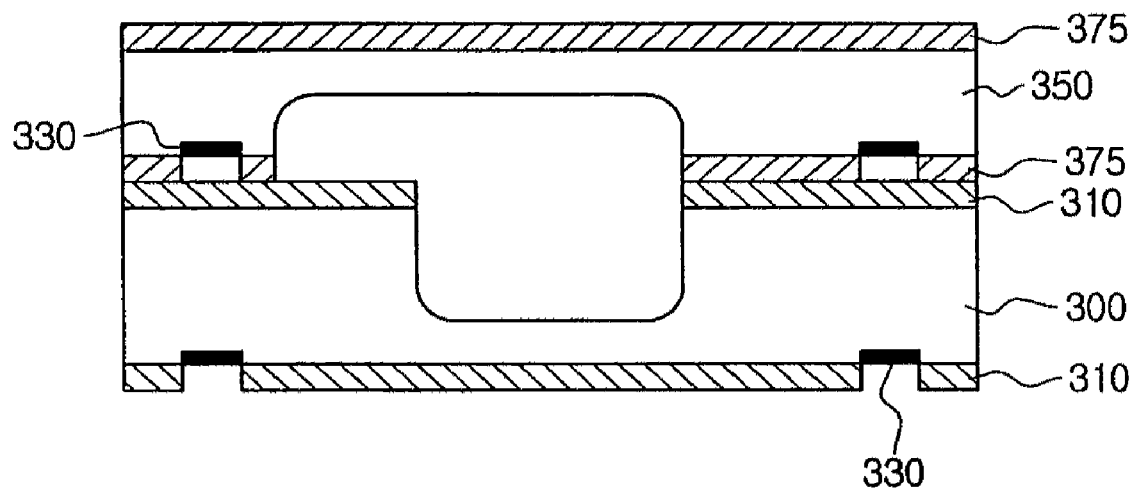
Figure 1G:
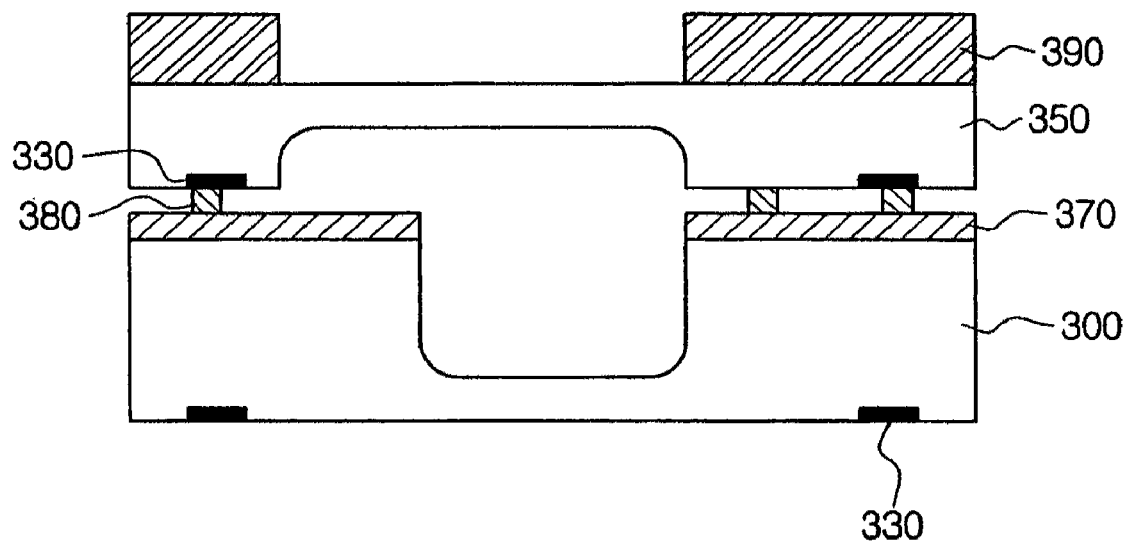
Figure 1H:
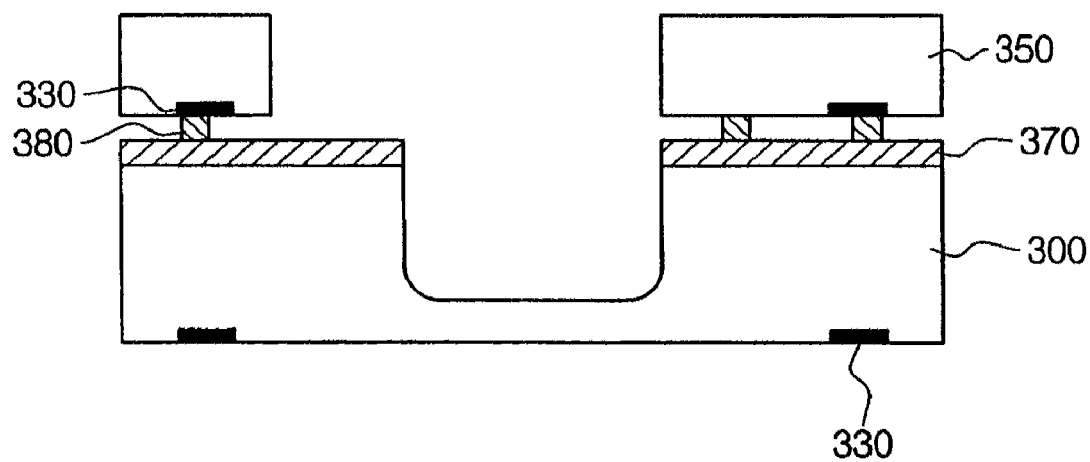

The method of multi-stage substrate etching of the embodiment includes the steps of conducting photo resist (PR) coating to one surface of a first substrate coated with an oxide film (FIG. 1A), forming an alignment key pattern (FIG. 1B), etching the first substrate to a predetermined depth (FIG. 1C), etching a second substrate to a predetermined depth (FIG. 1D), bonding the first and second substrates together (FIG. 1E or FIG. 1F), forming a mask pattern on the second substrate bonded (FIG. 1G), and etching the upper portion of the second substrate (FIG. 1H).

FIG. 1A shows the first substrate 300 having the oxide film 310 and the PR coating (320). The first substrate 300 is formed by the steps of depositing the oxide films 310 on both surfaces thereof, and forming the PR coating 320 on one surface of the first substrate 300 coated with the oxide film 310. In an embodiment, the oxide film 310 may comprise a silicon oxide film ($SiO_2$). The oxide film is a sacrificial layer for substrate etching, which layer may be any layer having a high etch ratio to a substrate. In some cases, the sacrificial layer may be replaced with the PR coating without the sacrificial layer such as an oxide layer.

FIG. 1B shows the first substrate having the alignment key pattern 330. The alignment key pattern 330 is used for precisely bonding the first substrate 300 to other substrate or structure. The first substrate having the alignment key pattern 330 is formed by the step of forming the alignment key pattern on the PR coated surface of the first substrate.

FIG. 1C shows the first substrate etched. The first substrate etched is formed by the steps of forming a desired pattern, i.e., a first mask pattern 340, on the other surface opposite to the alignment key pattern 330 (the opposite surface to the PR coated surface), and etching the first substrate 300 using the first mask pattern 340 as an etching mask to thereby form a hole 345. Here, the step of removing the PR coating 320 from the first substrate 300 may be carried out.

FIG. 1D shows the first substrate and the second substrate to be bonded to the first substrate. In FIGS. 1C and 1D, the step of removing the oxide film 310 from the first substrate 300 may also be carried out. Meanwhile, the second substrate 350 has the same thickness as a depth of a step to be formed according to an embodiment of the invention. First, the thickness of the second substrate is regulated to a desired thickness using a method such as CMP, lapping or polishing. Next, the second substrate etched as shown in FIG. 1D is formed by the steps of forming a second mask pattern (not shown) on the second substrate 350, and etching the second substrate 350 using the second mask pattern as an etching mask to thereby form a hole 365.

In an embodiment, before the formation of the second mask pattern, an oxide film, a sacrificial layer for etching, may be formed on the second substrate 350. In this case, the oxide film formed can be removed before eutectic bonding between the first substrate 300 and the second substrate 350. Further, in an embodiment, the alignment key pattern 330 for precise arrangement between the second substrate 350 and the first substrate 300 may be formed on one surface of the second substrate 350.

The second substrate 350 is irregularly etched so that an edge of the etched bottom surface has a radius of curvature. However, if the second substrate 350 is previously etched as such, the irregular etching of the etched bottom surface can be prevented through the process where the first and second substrates 300 and 350 are bonded together, and the second substrate 350 is etched to form a hole passing through the second substrate 350, thereby forming a step structure. To this end, the second substrate 350 may be etched such that the hole 365 has a depth ½ or more times the thickness of the substrate.

FIG. 1E shows the first substrate 300 and the second substrate bonded together according to an embodiment of the invention. In FIG. 1E, the bonding between two substrates is carried out through the steps of the formation of a metal layer 370 on the first substrate 300 for eutectic bonding, the formation of a solder line pattern 380 on the second substrate 350, and the eutectic bonding between the first substrate 300 and the second substrate 350. Here, the metal layer 370 may comprise Au, and the solder line pattern 380 may comprise Sn, so that two substrates can be bonded with Au—Sn eutectic bonding. Further, the metal layer 370 and the solder line pattern 380 may include one or more metals among Cr, Ti, Ni, and Au, so as to facilitate the eutectic bonding. However, this is only for illustration, and the metal layer and the solder line pattern may comprise any material suitable to eutectic bonding.

While above FIG. 1E and following drawings have illustrated the embodiments where the metal layer 370 is formed on the first substrate 300, and the solder line pattern 380 is formed on the second substrate 350, other embodiment may be provided where the solder line pattern 380 is formed on the first substrate 300, and the metal layer 370 is formed on the second substrate 350, so that two substrates are then eutectic bonded, which embodiments are included in the scope of the present invention.

Meanwhile, FIG. 1F shows the first substrate 300 and the second substrate 350 bonded together according to another embodiment. In FIG. 1F, the two substrates bonded are formed by the steps of the formation of the oxide film 375 on the second substrate 350, and the bonding of the first substrate 300 to the second substrate 350 using Si direct bonding. In a further embodiment, the substrates can be bonded together using silicon itself constituting two substrates instead of using the oxide films 310, 375.

In an embodiment, the first substrate 300 and the second substrate 350 can be precisely bonded together through arranging the two substrates using the alignment key pattern 330 formed on both the substrates as shown in FIGS. 1E and 1F.

FIG. 1G shows the second substrate 350 having, on the upper surface, the third mask pattern 390 so as to form a step through re-etching of the second substrate 350. The third mask pattern is aligned with the alignment key pattern 330 positioned on the lower surface of the first substrate 300 to thereby adjust the etching point of the second substrate 350. In an embodiment, the third mask pattern 390 may be formed identical to the second mask pattern so as to form the hole passing through the second substrate 350.

FIG. 1H shows the substrate having a step structure created after the etching of the second substrate 350 according to an embodiment of the present invention. The step structure shown in FIG. 1G is formed through the steps of etching the second substrate 350 using the third mask pattern 390 as an etching mask, and removing the third mask pattern 390 after the etching. In FIG. 1H, since the undersurface of the second substrate 350 is previously first-etched, if the upper surface of the second substrate 350 is second-etched to form a hole passing through the second substrate 350, an uniformly etched step structure is obtained without the occurrence of a problem of irregular etching of the etched bottom surface.

Figure 2:
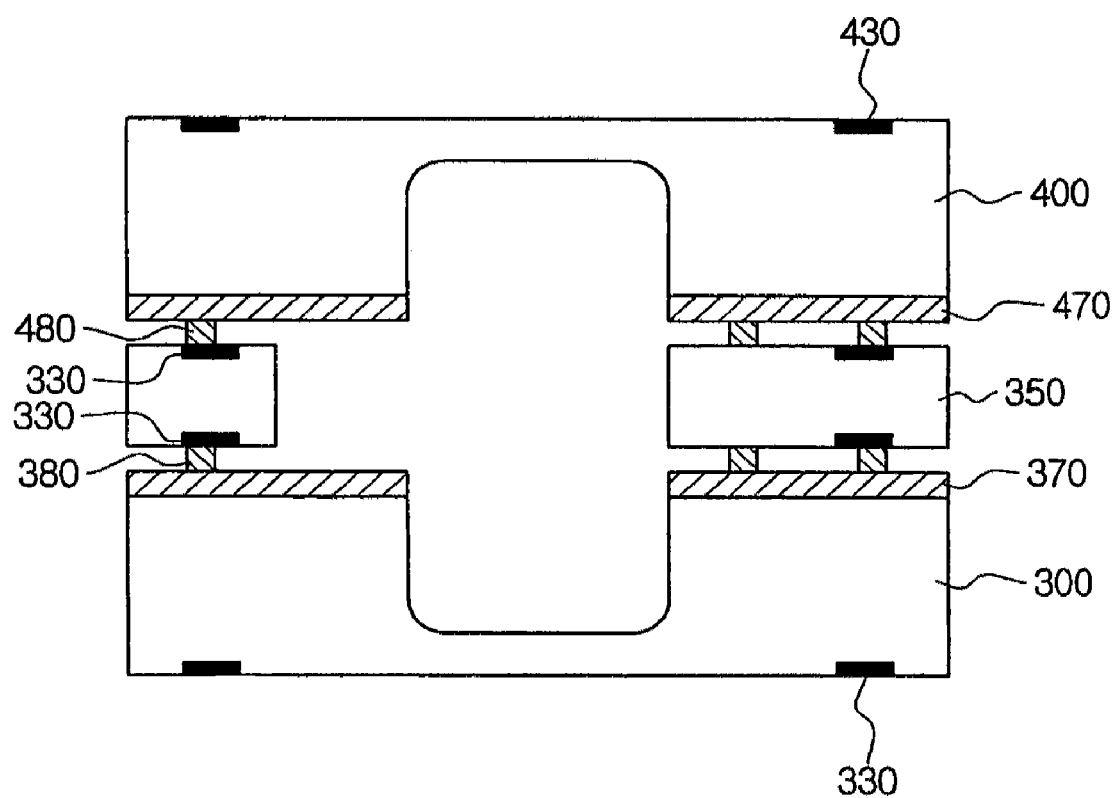
FIG. 2 is a view illustrating an exemplary embodiment of a terahertz oscillator manufactured using a method of multi-stage substrate etching according to the present invention.

FIG. 2 is a view illustrating an exemplary embodiment of a terahertz oscillator manufactured using a method of multi-stage substrate etching according to the present invention.

The oscillator in FIG. 2 is fabricated by bonding between two or more structures, which as illustrated in FIGS. 1A to 1H, are fabricated by the steps of forming a first mask pattern on one surface of a first substrate, forming a hole by etching the first substrate using the first mask pattern as an etching mask, forming a second mask pattern on one surface of a second substrate, forming a hole by etching the second substrate to a predetermined depth using the second mask pattern as an etching mask, bonding the first and second substrates together, forming a third mask pattern on the second substrate, and forming a hole passing through the second substrate by etching the second substrate using the third mask pattern as an etching mask.

The structures 400, 470, and 480 bonded upward are formed by a procedure shown in FIGS. 1A to 1H. Here, the bonding process of two or more structures may be a bonding process where the structures are bonded such that the holes formed in the structures are shared together. Further, for precise bonding, the structures may be arranged using the alignment key pattern 330, 430. The structures can be bonded using a Si direct bonding, eutectic bonding or other bonding method.

In an embodiment, various 3D structures can be provided wherein three or more structures may be bonded together in the above manner, and the number of the steps may be increased using plural substrates such as a third substrate, a fourth substrate, or others.

Figure 3A:
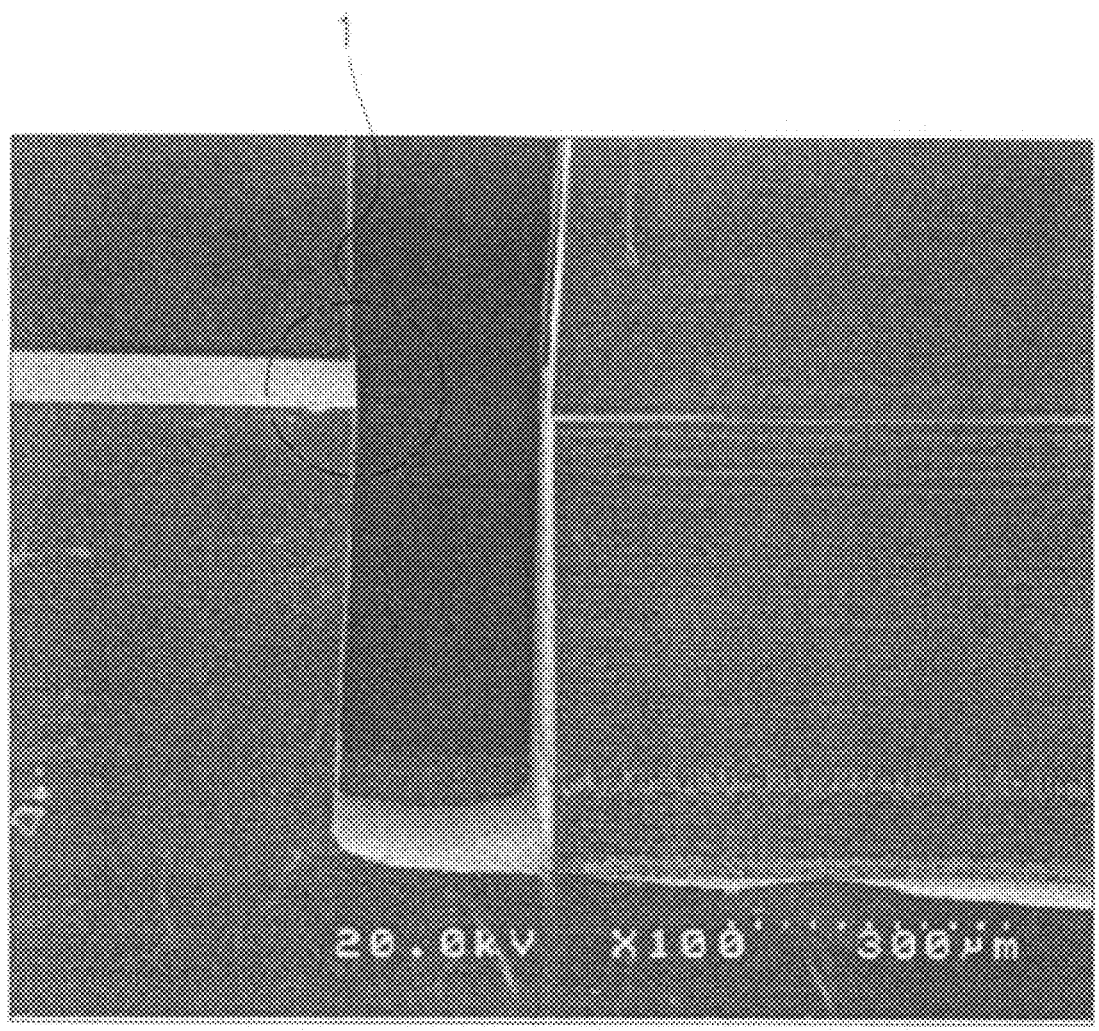
FIGS. 3A and 3B are views illustrating the structures realized using an exemplary embodiment of a method of multi-stage substrate etching according to the present invention.
Figure 3B:
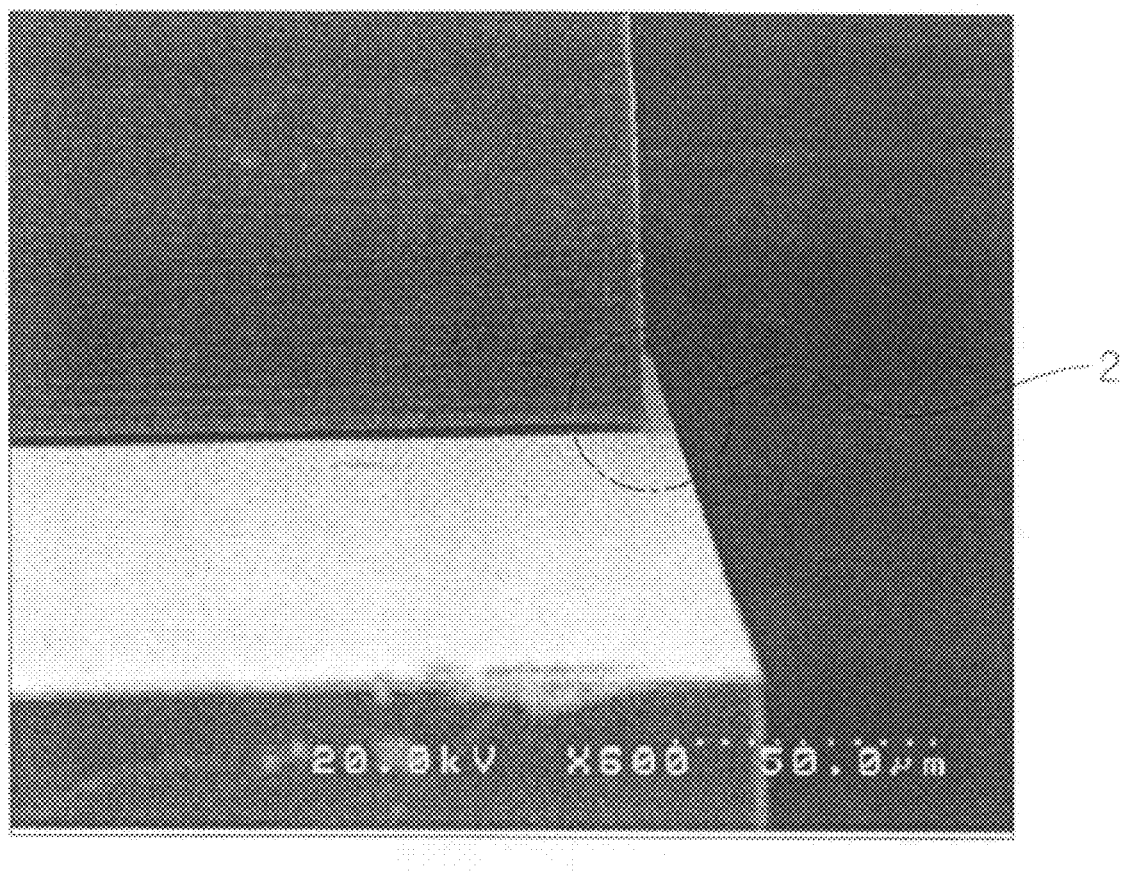

FIGS. 3A and 3B are views illustrating the structures realized using an exemplary embodiment of a method of multi-stage substrate etching according to the present invention. FIG. 3A shows the step structure formed according to an embodiment of the invention, wherein the bonded portion 1 of two substrates is uniformly etched so that an overhang structure occurring upon irregular etching of the upper substrate is not formed. FIG. 3B shows the enlarged step structure formed according to an embodiment of the invention, wherein the bonded portion 2 of the two substrates is also uniformly etched.

The method of multi-stage substrate etching according to the above-mentioned embodiments is applicable to manufacturing of the terahertz oscillator or amplifier, 3D substrate etching, or others. With the etching method, upon etching, the bottom surface can be uniformly maintained, and it can be prevented the occurrence of a radius of curvature in the bottom surface and the overhang structure occurring due to irregular etching of the edge of the upper surface of step. Thus, etching quality is improved, a precise bonding between the substrates can be obtained using the alignment key positioned on each substrate, and a multi-layer process is possible.

Although exemplary embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method of multi-stage substrate etching, comprising the steps of:
    forming a first mask pattern on one surface of a first substrate;
    forming a hole by etching the first substrate using the first mask pattern as an etching mask;
    forming a second mask pattern on one surface of a second substrate;
    forming a hole by etching the second substrate to a depth using the second mask pattern as an etching mask;
    bonding the first and second substrates together such that an etched surface of the first substrate faces an etched surface of the second substrate;
    forming a third mask pattern on the second substrate, wherein the third mask pattern has a same pattern as the second mask pattern;
    forming a hole passing through the second substrate by etching the second substrate using the third mask pattern as an etching mask; and
    removing the third mask pattern to form a step structure.

2. The method of multi-stage substrate etching according to claim 1, wherein the depth is ½ or more times a thickness of the second substrate.

3. The method of multi-stage substrate etching according to claim 1, wherein the step of bonding the first and the second substrates comprises the steps of:
    forming an oxide film on the second substrate; and
    bonding the first substrate and the second substrate together using the oxide film of the second substrate.

4. The method of multi-stage substrate etching according to claim 1, wherein the step of bonding the first and the second substrates comprises the steps of:
    forming a metal thin film on the first substrate;
    forming a solder line pattern on the second substrate; and
    eutectic-bonding the solder line pattern to the metal thin film.

5. A method of multi-stage substrate etching, comprising:
    forming a first mask pattern on one surface of a first substrate by,
        forming an oxide film of the first substrate,
        forming a photo resist (PR) coating on one surface of the first substrate having the oxide film,
        forming an alignment key pattern on the PR coated surface, and
        forming the first mask pattern on the surface opposite to the PR coated surface;
    forming a hole by etching the first substrate using the first mask pattern as an etching mask;
    forming a second mask pattern on one surface of a second substrate;
    forming a hole by etching the second substrate to a depth using the second mask pattern as an etching mask;
    bonding the first and second substrates together such that an etched surface of the first substrate faces an etched surface of the second substrate;
    forming a third mask pattern on the second substrate;
    forming a hole passing through the second substrate by etching the second substrate using the third mask pattern as an etching mask; and
    removing the third mask pattern to form a step structure.

6. The method of multi-stage substrate etching according to claim 5, wherein the step of bonding the first and the second substrates comprises the step of arranging the first substrate and the second substrate using the alignment key pattern.

* * * * *